United States Patent
Boulineau et al.

(10) Patent No.: US 6,833,159 B1
(45) Date of Patent: Dec. 21, 2004

(54) METHOD FOR APPLYING HYDROPHOBIC ANTI-REFLECTION COATINGS TO LENSES AND LENS BLANKS

(75) Inventors: Michael S. Boulineau, Forest Lake, MN (US); Thomas J. Moravec, Maple Grove, MN (US)

(73) Assignee: Vision-Ease Lens, Inc., Ramsey, MN (US)

( * ) Notice: Subject to any disclaimer, the term of this patent is extended or adjusted under 35 U.S.C. 154(b) by 0 days.

(21) Appl. No.: 09/562,686

(22) Filed: May 2, 2000

(51) Int. Cl.$^7$ ............................ B05D 5/06; C23C 16/22
(52) U.S. Cl. ..................... 427/167; 427/255.6; 427/294
(58) Field of Search ................ 427/162, 167, 427/248.1, 255.6, 294, 387

(56) References Cited

U.S. PATENT DOCUMENTS

| | | | | |
|---|---|---|---|---|
| 4,387,195 A | * | 6/1983 | Tully et al. .................. | 525/475 |
| 4,678,688 A | * | 7/1987 | Itoh et al. .................... | 427/387 |
| 4,737,476 A | * | 4/1988 | Hillig .......................... | 501/87 |
| 5,008,422 A | * | 4/1991 | Blum et al. .................. | 556/402 |
| 5,853,800 A | * | 12/1998 | Dombrowski et al. ....... | 427/162 |

FOREIGN PATENT DOCUMENTS

| | | | | |
|---|---|---|---|---|
| EP | O 561 016 A1 | | 9/1993 | ........... C23C/14/06 |
| EP | 0 842 711 A1 | | 5/1998 | ............ B05D/7/24 |
| JP | 05-215905 A | * | 8/1993 | ............ G02B/1/10 |

* cited by examiner

*Primary Examiner*—Shrive P. Beck
*Assistant Examiner*—William Phillip Fletcher, III
(74) *Attorney, Agent, or Firm*—Mark A. Litman & Associates, P.A.

(57) ABSTRACT

A method provides high-vacuum vapor coating methods, with the methods producing novel coating compositions with surprisingly increased performance levels over coatings produced from the same materials under different processing conditions. Compounds of the general formulae II, III and IV, defined herein, can be applied by vapor deposition from a merely compacted, rather than fused or sintered porous matrix source with improved performance, even where the same chemicals are used in the coating, at the same coating temperatures. The generally useful materials include silanes and siloxanes, and siloxazanes of formulae I, II, III and IV.

7 Claims, No Drawings

METHOD FOR APPLYING HYDROPHOBIC ANTI-REFLECTION COATINGS TO LENSES AND LENS BLANKS

BACKGROUND OF THE INVENTION

1. Field of the Invention

The present invention relates to the application of water-repellant or hydrophobic coatings on surfaces, particularly polymeric surfaces and most particularly to molded, cast or otherwise shaped polymeric surfaces such as lenses, and most particularly ophthalmic lenses.

2. Background of the Art

The convenience and shaping capability of polymeric materials has been one of its properties that has greatly expanded the field of use and acceptability of polymeric materials into many fields. On the other hand, the limitations in physical properties of polymers, both with regard to abrasion resistance and weathering have limited some of its application.

It is widespread prior art to provide the surfaces of optical components with thin coatings for their protection or in order to obtain certain functional properties. Optical components of this kind are, in the context of this invention, essentially optical lenses, spectacle lenses, and lenses for cameras, field glasses or for other optical apparatus, beam splitters, prisms, mirrors, window panes, etc. On the one hand, the aim of such coatings is to upgrade the surfaces of optical substrates, such that, by means of hardening and/or increasing the chemical resistance, damage caused by mechanical, chemical or environmental influences is avoided. This is particularly significant in the case of substrates comprising plastics materials. On the other hand, surface coatings are employed in order to reduce reflection, especially in the case of spectacle lenses and other lenses. In this context it is possible, given an appropriate choice of the coating materials, coat thickness, single- or multilayer construction comprising, if appropriate, different materials with differing refractive indices, to achieve a reduction in the reflection to less than 1% over the entire visible spectrum of radiation.

Upgrading or antireflection coats of this kind are produced using numerous oxide materials, for instance $SiO_2$, $TiO_2$, $ZrO_2$, $MgO_2$, $Al_2O_3$, and also fluorides such as $MgF_2$, and mixtures of these substances. Optical substrates are usually coated by the high-vacuum vapor deposition technique. In this procedure, the substrate and a charge containing the substance to be applied by vapor deposition are placed inside an appropriate high-vacuum vapor deposition apparatus, which is then evacuated, and then the substance is caused to vaporize by heating and/or by means of electron beams, and is deposited on the surface of the substrate as a thin coat. Appropriate apparatus and methods are common prior art.

Upgrading coats of this kind, however, especially antireflection coats, are extremely sensitive to soiling, for example by moist and/or greasy fingerprints. Impurities cause a strong increase in reflection; therefore, fingerprints become clearly visible. Effective cleaning to re-establish the original reflection level proves to be difficult. For this reason, it has become established practice to provide optical components, in addition, with a hydrophobicizing, i.e. water-repellent coating.

For hydrophobicizing the surfaces of optical substrates there is a range of substances available, in particular from the class of organosilicon compounds. These substances are, for example, silanes, siloxanes, silicones and silicone oils (silicone fluids). In general, these substances are applied by dipping or spin coating to the substrate surfaces to be treated, the substances being employed either in pure form or as solutions. Following surface treatment and, if appropriate, evaporation of solvent, a thermal after-treatment is usually carried out, whereby the water-repellent coating is consolidated and adhesion with the substrate material is brought about. In general, this gives coatings with satisfactory properties in respect of hydrophobicization, durability and long-term adhesion.

However, the coating technique necessary as a result of the nature of the customary hydrophobicizing agents is disadvantageous.

For instance, in dip coating and spin coating it is necessary to operate under strict clean-room conditions in order to rule out negative effects on quality, caused, for instance, by dust particles. Furthermore, these techniques require additional operations with corresponding apparatus and plant and may have an increased potential for loss of yield.

JP 05-215 905 discloses a process for preparing water-repellent coatings on optical substrates, which involves the application to the substrate surface of fluoroalkylsilazane compounds by means of a high-vacuum vapor deposition technique. An advantage of this process over the customary dip and spin coating techniques is that it can readily be carried out in existing high-vacuum vapor deposition apparatus, for instance directly after the vapor coating of the substrate with antireflection or other upgrading coats. The perfluoroalkylsilazane compounds are preferably introduced in a form in which a porous metallic sintered material is saturated with the substance.

However, it has been found that the use of polyfluoroalkylsilazane compounds in a high-vacuum vapor deposition process of this kind is disadvantageous. The substances per se are already unstable, which manifests itself in their distinct odor of ammonia. They decompose and are not stable on storage. In the course of vapor coating, the compounds suffer at least partial decomposition, during which ammonia gas is liberated. This causes corrosion in the apparatus and in the associated high-vacuum pumps and also, possibly, on the optical substrates; in addition, there is a risk of reaction of ammonia with the pump oils in the high-vacuum pumps.

U.S. Pat. No. 5,853,800 described a material for and method of preparing water-repellent coatings on optical substrates. The invention relates to a material for and method of preparing water-repellent coatings on optical substrates. Compounds of formula I

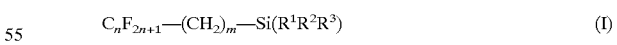

in which

R$^1$ is alkoxy having 1 to 3 carbon atoms or is $C_nF_{2n+1}$—$(CH_2)_m$—$Si(R^2R^3)$—O—, R$^2$ and R$^3$ are alkyl or alkoxy having 1 to 3 carbon atoms, n is 1 to 12; and m is 1 to 6, are applied to the substrates by thermal vapor coating in a high vacuum from a matrix of inorganic oxides.

U.S. Pat. No. 4,678,688 describes a method for forming a surface film of cured organosilicon polymer on a substrate surface, the polymer comprising units derived from at least one or more monomeric compounds from within the group:

$$R^1{}_a SiO_{(4-a)/2} \qquad (II)$$

$$R^2{}_b Si(N^3)O_{(4-b)/2} \qquad (III)$$

$$R^1{}_c X_d SiO_{(4-c-d)/2} \qquad (IV)$$

with the respective groups being defined as compositions useful in preparing abrasion resistant coatings for polymeric surfaces.

SUMMARY OF THE INVENTION

The invention has discovered a more effective method for the preparation of coatings in high-vacuum vapor coating methods, with the methods producing novel coating compositions with surprisingly increased performance levels over coatings produced from the same materials under different processing conditions. It has now been found that compounds of the general formulae II, III and IV can be applied by vapor deposition from a merely compacted, rather than fused or sintered porous matrix source (as described in U.S. Pat. No. 5,853,800) with improved performance. This improved performance may even occur where the same chemicals are used in the coating, at the same coating temperatures. The generally useful materials include silanes and siloxanes, and siloxazanes of formulae I, II, III and IV:

$$C_n F_{2n+1}-(CH_2)_m-Si(R^1 R^2 R^3) \qquad (I)$$

in which $R^1$ is alkoxy having 1 to 3 carbon atoms or is $$C_n F_{2n+1}-(CH_2)S_m-Si(R^2 R^3)-O-$$

$R^2$ and $R^3$ are alkyl or alkoxy having 1 to 3 carbon atoms, n is 1 to 12 and m is 1 to 6; and organosiloxazanes, such as those comprising polymers derived from at least one, and preferably combinations of two or more monomers, each one selected from a different formula, wherein the monomers may be of the formulae:

$$R^1{}_a SiO_{(4-a)/2} \qquad (II)$$

$$R^2{}_b Si(NR^3)O_{(4-b)/2} \qquad (III)$$

$$R^1{}_c X_d SiO_{(4-c-d)/2} \qquad (IV)$$

wherein in the unit formulae (II and IV) for the organosiloxane unit, $R^1$ is a hydrogen atom or a monovalent hydrocarbon group exemplified by alkyl groups such as methyl, ethyl, propyl and butyl groups, aryl groups such as phenyl and tolyl groups, alkenyl groups such as vinyl and allyl groups and cycloalkyl groups such as cyclohexyl group as well as those substituted hydrocarbon groups obtained by the replacement of a part or all of the hydrogen atoms in the above named hydrocarbon groups with substituent atoms or groups such as halogen atoms and cyano groups. The groups denoted by $R^1$ in a molecule may not be of the same kind but two or more kinds of the groups can be contained in a molecule although it is preferable that not all of the groups $R^1$ in a molecule are hydrogen atoms. The subscript a is 1, 2 or 3 to give tri-, di- and monofunctional siloxane units, respectively. $R^2$ is a hydrogen atom or a monovalent hydrocarbon group exemplified by alkyl groups such as methyl, ethyl, propyl and butyl groups, aryl groups such as phenyl and tolyl groups, alkenyl groups such as vinyl and allyl groups and cycloalkyl groups such as cyclohexyl group as well as those substituted hydrocarbon groups obtained by the replacement of a part or all of the hydrogen atoms in the above named hydrocarbon groups with substituent atoms or groups such as halogen atoms and cyano groups. $R^3$ may be an aliphatic or aromatic hydrocarbon group such as methyl, ethyl, propyl and butyl groups, aryl groups such as phenyl and tolyl groups, alkenyl groups such as vinyl and allyl groups and cycloalkyl groups such as cyclohexyl group as well as those substituted hydrocarbon groups obtained by the replacement of a part or all of the hydrogen atoms in the above named hydrocarbon groups with substituent atoms or groups such as halogen atoms and cyano groups.

As is mentioned above, the monovalent hydrocarbon group denoted by $R^1$ may be at least partially substituted by various kinds of substituent atoms and groups according to the particular curing behavior of the polymer and performance and properties desired of the resultant polymer and the cured product thereof. Some of the substituents include halogen atoms, alkoxy groups such as methoxy and ethoxy groups, amino group, cyclohexylamino group, oxime group, epoxy group, acryloxy group, methacryloxy group and the like. Particular examples of such substituted hydrocarbon groups include those expressed by the formulas $CF_3CH_2CH_2-$, $Gl-O-CH_2)_3-$, $CH_2=CHCOO(CH_2)_3-$, $CH_2=CMeCOO(CH_2)_3-$, and $NH_2(CH_2)_3$, in which the symbols Me and Gl denote a methyl and a glycidyl group, respectively.

The units of the other type essentially contained in the molecule of the organosiloxazane polymer in combination with the above described organosiloxane units are the organosilazane units represented by the unit formula (III) above given, in which $R^2$ and $R^3$ are each a hydrogen atom or a monovalent hydrocarbon group selected from the class consisting of the above named groups given as the examples of the hydrocarbon groups for $R^1$ in the unit formula (II) although not all of the groups $R^2$ in a molecule are preferably hydrogen atoms. Several examples of the units in conformity with the formula (II) include: $MeSi(NH)_{1.5}$; $CH_2=CHSi(NH)_{1.5}$, $EtSi(NH)_{1.5}$, $n-C_{10}H_{21}Si(NH)_{1.5}$; $(CF_3)_2CF(CF_2)_8CH_2CH_2Si(NH)_{1.5}$; $PhSi(NH)_{1.5}$; $Me(MeO)Si(NH)_{1.0}$; $Me(MeEtC=NO)Si(NH)_{1.0}$; $CH_2=CMeCOO(CH_2)_3(OMe)Si(NH)_{1.0}$; and $NH_2(CH_2)_3Si(NH)_{1.5}$, in which the symbols Me, Et and Ph each denote a methyl, an ethyl and a phenyl group, respectively.

With regard to Formula IV, $R^1$ has the same meaning as defined above, $R^4$ is a divalent hydrocarbon group exemplified by alkylene groups such as ethylene, propylene and butylene groups and arylene groups such as phenylene and tolylene groups, e is zero, 1 or 2, f is zero, 1 or 2, g is 1, 2 or 3 with the proviso that f+g is not larger than 4 and m, n and p are each a positive integer. X is a halogen atom, e.g., Fl, Cl, Br and I, preferably Cl. The chlorine-containing organosilicon compound (ii) to be reacted with the above described chlorine-containing organopolysiloxane (i) is preferably a silane or polysilane compound and suitable silane compounds therefor are exemplified by those compounds expressed with the following formulas including:

$$R^2{}_h SiX_{4-h};$$

$$X_{3-e}R^2{}_e Si\text{-}[SiR^2{}_2 O]_m\text{-}[SiX\ R^2]_n\text{-}[SiX_2]_p SiR^2{}_e X_{3-e};$$

and $$X_{3-e}R^2{}_e SiR^4\text{-}[SiR^2{}_2 R^4]_m\text{-}[SiClR^2 R^4]_n\text{-}[SiX_2 R^4]_p SiR^2{}_e Cl_{3-e};$$

$$R^2{}_j Si\text{-}[OR^2]_j X_{4-i-j};$$

in which h is zero, 1, 2 or 3, i is zero, 1, 2 or 3 and j is zero, 1, 2 or 3 with the proviso that i+j is 1, 2 or 3, X is a halogen atom (e.g., Cl, Br, F, and I, preferably Cl) and $R^2$, $R^4$, e, m, n and p each have the same meaning as defined above.

These compounds are ideally suited to the preparation of water-repellent coatings on optical substrates by thermal vapor coating, preferably in a high vacuum, preferably from a non-sintered porous source for the silicon containing material.

DETAILED DESCRIPTION OF THE MENTION

The invention relates to a method of preparing coatings of silicon-containing compounds that react to form coatings on polymeric surfaces, particularly optical substrates, and most particularly ophthalmic lens surfaces by thermal vapor coating with organosilane compounds, preferably in a high vacuum, which is characterized in that vapor coating is performed with compounds of the formula I, II, III and IV. With regard to the compounds of formula I, II, III and IV, the use of a compacted, as opposed to sintered or thermally fused porous support for carrying the silicon-containing compounds, provides improved performance in the coating, at least in the form of more durable surface-wetting characteristics after abrasion.

The invention additionally relates to the use of compounds of the formula II, III and IV for preparing water-repellent coatings or abrasion resistant coatings (also referred to in the art as bard coatings) on optical substrates.

In the organosilicon compounds of the formula I one radical is a polyfluoroalkyl group composed of a terminal perfluoroalkyl group having 1 to 12 carbon atoms which is attached to the silicon atom via an alkylene group having 1 to 6 carbon atoms. Of the other radicals connected to the silicon atom, $R^1$, $R^2$ and $R^3$, at least one radical ($R^1$) is an alkoxy group having 1 to 3 carbon atoms. The other radicals ($R^2$ and $R^3$) can be alkyl or alkoxy groups each having 1 to 3 carbon atoms. The radical $R^1$ can also be a siloxyl group in which one radical is a polyfluoroalkyl group as described above. The other two radicals attached to the silicon atom ($R^2$ and $R^3$) may, in turn, be the alkyl or alkoxy groups already defined. Examples of typical compounds of the formula I are triethoxy(3,3,4,4,5,5,6,6,7,7,7-undecafluoroheptyl)silane, triethoxy(3,3,4,4,5,5,6,6,7,7,8,8,8-tridecafluorooctyl)silane, triethoxy(3,3,4,4,5,5,6,6,7,7,8,8,9,9,10,10,10-heptadecafluorodecyl)silane, diethoxymetyl(3,3,4,4,5,5,6,6,7,7,8,8,9,9,10,10,10-heptadecafluorodecyl)silane, bis[ethoxymethyl(3,3,4,4,5,5,6,6,7,7,8,8,8-tridecafluorooctyl)]silyl ether.

The compounds of the formula I are known per se and the majority of them are commercially available. The remainder can be obtained readily in accordance with known preparation methods. The compounds of the formula I are particularly stable on storage.

U.S. Pat. No. 4,678,688 describes a method for forming a surface film of cured organosilicon polymer on a substrate surface with coatings derived from one or more (e.g., at least two different compounds from different formula e, a t least three different compounds from three different formulae) silicon containing compounds of the formulae:

  (II)

  (III)

  (IV)

As is described above, silicon-containing materials that form polymers, and especially the organosiloxazane polymer used in the method of the invention is composed of two types of the monomeric units including the organosiloxane units and organosilazane units represented by the unit formulas (II) and (III), respectively. $R^2$ and $R^3$ are defined in that patent, and include, for example, but without limitation of that disclosure, alkyl, aryl, phenyl, mixed alkyl-aryl, phenoxy, acryloyl, and other active groups with linking groups (e.g., alkylene groups).

In the unit formula (II) for the organosiloxane unit, $R^1$ is a hydrogen atom or a monovalent hydrocarbon group exemplified by alkyl groups such as methyl, ethyl, propyl and butyl groups, aryl groups such as phenyl and tolyl groups, alkenyl groups such as vinyl and allyl groups and cycloalkyl groups such as cyclohexyl group as well as those substituted hydrocarbon groups obtained by the replacement of a part or all of the hydrogen atoms in the above named hydrocarbon groups with substituent atoms or groups such as halogen atoms and cyano groups. The groups denoted by $R^1$ in a molecule may not be of the same kind but two or more kinds of the groups can be contained in a molecule although it is preferable that not all of the groups $R^1$ in a molecule are hydrogen atoms. The subscript a is 1, 2 or 3 to give tri-, di- and monofunctional siloxane units, respectively. $R^2$ is a hydrogen atom or a monovalent hydrocarbon group exemplified by alkyl groups such as methyl, ethyl, propyl and butyl groups, aryl groups such as phenyl and tolyl groups, alkenyl groups such as vinyl and allyl groups and cycloalkyl groups such as cyclohexyl group as well as those substituted hydrocarbon groups obtained by the replacement of a part or all of the hydrogen atoms in the above named hydrocarbon groups with substituent atoms or groups such as halogen atoms and cyano groups. $R^3$ may be an aliphatic or aromatic hydrocarbon group such as methyl, ethyl, propyl and butyl groups, aryl groups such as phenyl and tolyl groups, alkenyl groups such as vinyl and allyl groups and cycloalkyl groups such as cyclohexyl group as well as those substituted hydrocarbon groups obtained by the replacement of a part or all of the hydrogen atoms in the above named hydrocarbon groups with substituent atoms or groups such as halogen atoms and cyano groups.

As is mentioned above, the monovalent hydrocarbon group denoted by $R^1$, $R^2$ and $R^2$ may be at least partially substituted by various kinds of substituent atoms and groups according to the particular curing behavior of the polymer and performance and properties desired of the resultant polymer and the cured product thereof. Some of the substituents include halogen atoms, alkoxy groups such as methoxy and ethoxy groups, amino group, cyclohexylamino group, oxime group, epoxy group, acryloxy group, methacryloxy group and the like. Particular examples of such substituted hydrocarbon groups include those expressed by the formulas $CF_3CH_2CH_2—$, $Gl-OCH_2)_3—$, $CH_2=CHCOO(CH_2)_3—$, $CH_2=CMeCOO(CH_2)_3—$, and $NH_2(CH_2)_3—$, in which the symbols Me and Gl denote a methyl and a glycidyl group, respectively.

The units of the other type essentially contained in the molecule of the organosiloxane polymer in combination with the above described organosiloxane units are the organosilazane units represented by the unit formula (II) above given, in which $R^2$ and $R^3$ are each a hydrogen atom or a monovalent hydrocarbon group selected from the class consisting of the above named groups given as the examples of the hydrocarbon groups for $R^1$ in the unit formula (I) although not all of the groups $R^2$ in a molecule are preferably hydrogen atoms. Several examples of the units in conformity with the formula (III) include: $MeSi(NH)_{1.5}$; $CH_2=CHSi(NH)_{1.5}$; $EtSi(NH)_{1.5}$; $n—C_{10}H_{21}Si(NH)_{1.5}$; $(CF_3)_2CF(CF_2)_8CH_2CH_2Si(NH)_{1.5}$, $PhSi(NH)_{1.5}$, $Me(MeO)$ $Si(NH)_{1.0}$; $Me(MeEtC=NO)Si(NH)_{1.0}$; $CH_2=CMeCOO(CH_2)_3(OMe)Si(NH)_{1.0}$; and $NH_2(CH_2)_3Si(N)_{1.5}$, in which the symbols Me, Et and Ph each denote a methyl, an ethyl and a phenyl group, respectively.

The organosiloxazane polymer composed of the above described two types of the monomeric units and used in the inventive method can be prepared by the reaction of ammonia or a primary amine compound with a mixture of (i) an organopolysiloxane represented by the above given average unit formula (III) having at least one silicon-bonded halogen atom and (ii) an organosilicon compound or organosilane compound having at least one halogen atom directly bonded to the silicon atom in a molecule. The organopolysiloxane of the average unit formula (III) is exemplified by those compounds expressed by the following formulas:

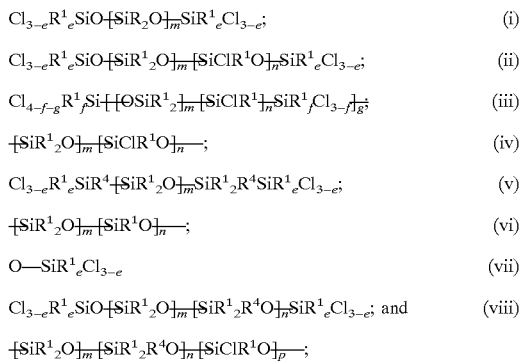

(i) $Cl_{3-e}R^1{}_eSiO[SiR^1{}_2O]_m\!\!-\!\!SiR^1{}_eCl_{3-e}$;

(ii) $Cl_{3-e}R^1{}_eSiO[SiR^1{}_2O]_m[SiClR^1O]_n\!\!-\!\!SiR^1{}_eCl_{3-e}$;

(iii) $Cl_{4-f-g}R^1{}_fSi[[OSiR^1{}_2]_m[SiClR^1]_n\!\!-\!\!SiR^1{}_fCl_{3-f}]_g$;

(iv) $[SiR^1{}_2O]_m[SiClR^1O]_n\!\!-$;

(v) $Cl_{3-e}R^1{}_eSiR^4[SiR^1{}_2O]_m\!\!-\!\!SiR^1{}_2R^4SiR^1{}_eCl_{3-e}$;

(vi) $[SiR^1{}_2O]_m[SiR^1O]_n\!\!-$;

(vii) $O\!\!-\!\!SiR^1{}_eCl_{3-e}$;

(viii) $Cl_{3-e}R^1{}_eSiO[SiR^1{}_2O]_m[SiR^1{}_2R^4O]_n\!\!-\!\!SiR^1{}_eCl_{3-e}$; and $[SiR^1{}_2O]_m[SiR^1{}_2R^4O]_n[SiClR^1O]_p\!\!-$;

in which $R^1$, $R^2$, and $R^3$ have the same meanings as defined above (especially in the reference, U.S. Pat. No. 4,678,688, $R^4$ is a divalent hydrocarbon group exemplified by alkylene groups such as ethylene, propylene and butylene groups and arylene groups such as phenylene and tolylene groups, e is zero, 1 or 2, f is zero, 1 or 2, g is 1, 2 or 3 with the proviso that f+g is not larger than 4 and m, n and p are each a positive integer. The above described chlorine-containing organopolysiloxane compound (i) can be prepared in several known synthetic methods including, for example, the equilibration polymerization reaction between a cyclic organopolysiloxane compound and a chlorosilane compound such as dimethyl dichlorosilane, methyl trichlorosilane and silicon tetrachloride, partial hydrolysis reaction of an organochlorosilane compound, chlorination reaction of an organohydrogenpolysiloxane having at least one silicon-bonded hydrogen atom in a molecule or an addition reaction thereof with a chlorine-containing alkenylsilane compound and addition reaction of an alkenyl-containing organopolysiloxane and a chlorine-containing silane compound having at least one silicon-bonded hydrogen atom in a molecule.

The chlorine-containing organosilicon compound (ii) to be reacted with the above described chlorine-containing organopolysiloxane (i) is preferably a silane or polysilane compound and suitable silane compounds therefor are exemplified by those compounds expressed with the following formulas including:

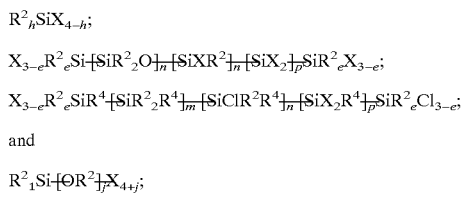

$R^2{}_hSiX_{4-h}$;

$X_{3-e}R^2{}_eSi[SiR^2{}_2O]_n[SiXR^2]_n[SiX_2]_p SiR^2{}_eX_{3-e}$;

$X_{3-e}R^2{}_eSiR^4[SiR^2{}_2R^4]_m[SiClR^2R^4]_n[SiX_2R^4]_p SiR^2{}_eCl_{3-e}$;

and $R^2{}_iSi[OR^2]_jX_{4+j}$;

in which h is zero, 1, 2 or 3, i is zero, 1, 2 or 3 and j is zero, 1, 2 or 3 with the proviso that i+j is 1, 2 or 3, X is a halogen atom (e.g., as described above) and $R^2$, $R^4$, e, m, n and p each have the same meaning as defined above. These (poly)silane compounds can be prepared in several known methods including, for example, the chlorination reaction of an organopolysilane compound having at least one silicon-bonded hydrogen atom in a molecule, addition reaction between a halogen-containing alkenylsilane compound and a chlorine-containing silane compound having a silicon-bonded hydrogen atom in a molecule and partial alkoxylation reaction of a chlorine-containing silane compound.

The organosiloxazane polymer of the invention is prepared by the reaction of the above described organopolysiloxane compound (i) and the halogen-containing organosilane compound (ii) with ammonia or a primary amine, preferably, in the presence of an organic solvent. Ammonia is preferred as the reactant to primary amines in view of the higher efficiency of the reaction. The type of the organic solvent is not particularly limitative provided that it is inert to the reactants of the organosilicon compounds and ammonia or primary amines and capable of dissolving the organosiloxazane polymer formed by the reaction including, for example, aromatic hydrocarbons such as benzene, toluene and xylene, chlorinated hydrocarbons such as methylene chloride and trichloroethane, ethers such as diethyl ether and tetrahydrofuran, ketones such as acetone, methyl ethyl ketone, methyl isopropyl ketone and methyl isobutyl ketone, and the like. These organic solvents may be used as a mixture of two kinds or more according to need. The volume of the organic solvent is not particularly limitative and should be selected in consideration of the amount of the ammonium chloride formed as a by-product in the reaction mixture and gelation of the resultant polymer product possibly taking place when the volume of the organic solvent is too small.

Since the reaction proceeds exothermically, no intentional heating of the reaction mixture is usually necessary and the reaction should be performed at a temperature in the range from 0° C. to 50° C., which can be accomplished by having the surface onto which the materials are deposited preheated to temperatures of, for example, 20° C. to 80° C. The molar ratio of the halogen-containing organopolysiloxane compound (i) and the halogen-containing organosilane compound (ii) in the reaction mixture is not particularly limitative and can be varied within a wide range depending on the types and properties of the desired organosiloxazane polymer. It should be noted, however, that increase in the amount of the halogen-containing silane compound (ii) containing a relatively large amount of halogen may result in the increase in the curing velocity of the organosiloxazane polymer obtained by the reaction due to the increased content of the highly hydrolyzable silazane linkages. Such an effect of increasing the curing velocity of the polymer product is also obtained when the halogen content in the halogen-containing organopolysiloxane (i) or the halogen-containing silane compound (ii) is increased.

The molecular structure of the resultant polymer product can be controlled by suitably selecting the reactants (i) and (ii) to meet the requirement. For example, the reaction started with a linear diorganopolysiloxane terminated at both molecular chain ends each with a silicon-bonded chlorine atom gives an organosiloxazane polymer having a linear organopolysiloxane structure in the main chain.

When the reaction is performed in the above described manner, the organosiloxane polymer as the reaction product is obtained in the form of a solution in the organic solvent used as the reaction medium. If necessary, the resultant reaction mixture should be diluted with a suitable organic solvent as exemplified above, which may be the same as or different from the solvent used as the reaction medium, to give an appropriate concentration of the polymer and viscosity of the solution in consideration of the work ability in the subsequent application of the polymer solution.

It is of course optional with an object to improve the work ability of the polymer solution and the properties of the cured film formed of the polymer that the resultant polymer solution is further admixed with various kinds of additives including fillers, coloring agents and the like provided that the additive is not reactive with the silazane linkages in the polymer as is the case when a silanol compound, alcoholic compound or water is added.

The adhesion is complete not only to the substrates such as polymer, glass, ceramic, aluminum and the like on which considerably good adhesion is obtained even with conventional curable silicone compositions but also to the substrate materials such as various kinds of plastics including, in particular, polycarbonate and acrylic resins and synthetic rubbers to which no good adhesion of cured silicone compositions can be obtained without the use of a primer. It is of course optional to accelerate curing of the coating film of the polymer by heating with hot air or infrared radiation. Further, the coating solution may be admixed with certain curing catalysts known to accelerate the silanol condensation reaction such as fatty acid salts of tin, lead, iron and the like metal or alkyl titanates when acceleration of curing is desired. When the hydrocarbon groups in the polymer have a sensitivity to actinic radiations such as acryloxy and methacryloxy groups as a substituent group on the monovalent group denoted by $R^1$ or $R^2$ forming, for example, a 3-acryloxypropyl group of the formula $CH_2=CHCOCCH_2CH_2CH_2-$, or 35 methacryloxypropyl group of the formula $CH_2=CMeCOCCH_2CH_2CH_{27}$, the cured film of the inventive polymer can be imparted with a further increased crosslinking density by the irradiation with ultraviolet light, electron beams and other actinic rays.

It may be preferable, in certain circumstances, that the organosiloxazane polymer comprises, in the molecular structure thereof, at least one sequence of dihydrocarbylsiloxane units of the formula $-\!\!\operatorname{\left[ SiR^1_2O \right]}_{\overline{m}}$, in which $R^1$ has the meaning as defined above or, more preferably, is a methyl group and m is a positive integer of at least 8. An organosiloxazane polymer containing at least one of such a dihydrocarbylsiloxane or dimethylsiloxane moiety in the molecule can be prepared by use of a chlorine-terminated diorganopolysiloxane of the formula $Cl\!\!-\!\!\operatorname{\left[ SiR^1_2O \right]}_{\overline{m}}\!\!-\!\!_1SiR^1_2Cl$, in which $R^1$ and m each have the meaning as defined above, as the organopolysiloxane represented by the average unit formula (III) as one of the reactants to be reacted with ammonia or a primary amine compound. When a cured surface film having a low surface tension is desired, at least a part of the monovalent groups denoted by $R^1$ or $R^2$ should preferably be substituted with a perfluoroalkyl group as exemplified by 2-(perfluorooctyl)ethyl and 2-(perfluorobutyl)ethyl groups.

In the following, examples are given to illustrate the inventive method for the formation of a cured film of silicon-containing polymer and particularly an organosiloxazane polymer as well as the method for the preparation thereof in more detail. In the following description, the symbol Me denotes a methyl group.

It has been found that the compounds can be evaporated readily (preferably in a high vacuum, or at least in an inert environment) at temperatures of between 200° C. to 600° C. or 300° C. to 500° C., and deposit on substrate surfaces to form thin coats. In this process, the compounds of the formulae II, III and IV either have no tendency to decompose, or any cleavage products are in no way aggressive or corrosive to optical substrates or to the constituents of high-vacuum vapor coating plant, vacuum pumps and pump oils.

For the method according to the invention for preparing water-repellent coats on optical substrates it is possible to employ high-vacuum vapor coating plant as is commonly used to produce optical coats, especially antireflection coats or upgrading coats for surface hardening. In this case, the compounds of the formula II, III, and/or IV in appropriate form and manner, are introduced in place of the other vapor coating materials into the apparatus. It is expedient to carry out the vapor coating step with compounds of the formula II, III, and/or IV directly after preceding vapor coating processes, for instance, for applying antireflection coats, since in this case the substrate is already in the plant. After applying the upgrading coats, no further pretreatment of the substrates is necessary before the vacuum coating by evaporation. A particularly expedient form of introducing the compounds of the formula I into the vapor coating apparatus is that in which the compound is introduced in a porous, inorganic oxide matrix. U.S. Pat. No. 5,853,800 describes a particular material of this kind for preparing water-repellent coatings on optical substrates by vapor coating in a high vacuum consists, accordingly, of a porous, inorganic oxide matrix containing a compound of the formula I. The porous, inorganic oxide matrix preferably consists of $SiO_2$, $TiO_2$, $ZrO_2$, $MgO$, $Al_2O_3$ or mixtures thereof. Those matrix materials were formed by the sintering or thermal fusion of the inorganic oxide particles into a fused matrix. These matrices are likewise part of the invention for use with compounds of formulae II, III and/or IV, but, of course cannot be included with regard to the application of compounds of formula I. The matrices of U.S. Pat. No. 5,853,800 are prepared, for instance, by tableting the matrix material, which is usually in finely divided form with particle sizes of between 5 $\mu$m and 20 $\mu$m, and then subjecting these tablets to sintering in the manner customary for the respective material.

For the abovementioned materials, this sintering step is typically carried out at temperatures between 900° C. and 1400° C. over a period of 1 to 10 hours. Depending on the particle size of the primary particles, on densification and on sintering conditions, the resulting porous sintered articles have a porosity of from 40 to 60%. The sintered articles formed from the porous, inorganic oxide matrix can then be loaded with the compounds of the formula I, II, III and/or IV. This is carried out by impregnating the sintered articles with compounds of the formula I, II, III and/or IV or applying the latter dropwise to the sintered articles, where these compounds are liquid, or by carrying out the same operations with solutions of compounds of the formula I, II, II and/or IV. It is expedient to load the sintered articles with predetermined quantities of compound of the formula I, II, III and/or IV since by means of the quantitative determination of the content of each such loaded article it is readily possible to predetermine the thickness of the coat on the optical substrate to be coated.

It has been surprisingly found in the practice of the vapor deposition process that use of the tableted inorganic oxide materials, without sintering the particles, provides a better coating from the same chemical materials (e.g., II, III and IV) than the otherwise identical process using the sintered inorganic oxide particles. There is absolutely no reason to expect or explain this result, and that result is therefore completely surprising and unexpected in view of the art. A sintered porous matrix as described in the prior art would have the inorganic oxides fused together in an inflexible, rigid fused matrix of particles. When external pressure is applied (e.g., shearing and compacting pressure), a force of sufficient magnitude to rupture the fusion points of the particles will cause breakage of the bonds along fractures or seams. In a compacted (non-fused) matrix described in the present invention, shearing and compacting forces can more readily cause removal of layers or sections of particles, rather than effecting only actual breaking of the article along seams or fracture lines. By way of further describing the physical differences between a fused or sintered matrix and a compacted matrix, the forces needed to remove particles from a compacted matrix is significantly less with respect to the forces needed for removal of particles from a fused or sintered matrix. The compacted matrix, like any typical tablet or compacted or physically adhered mass, will crumble readily rather than shear along break lines.

Fusion with inorganic oxides materials also tends to be a truly chemical reaction, with covalent oxygen bonds forming between oxygen atoms and multiple nominative atoms (e.g., a single oxygen atom may form a chemical bridge between Si, Al, Ti, Zr or other inorganic atoms that name the oxide (e.g., silica alumina, titania and zirconia, respectively). On the other hand, the matrix formed by compaction may have hydrogen bonding, ionic bonding, van der Waals forces, and the like, but does not have the true inorganic oxide, fused matrix chemical bonding structure of fired or sintered inorganic oxides (forming ceramics or glasses).

In order to prepare water-repellent or hard coat coatings on optical substrates it is sufficient to charge a high-vacuum vapor coating plant of conventional kind, into which the substrate to be coated has been introduced, with a compound of the formula I, II, III and/or IV, preferably in the form of a shaped inorganic oxide article loaded with the compound. On reaching a stable final vacuum, for instance in the range between $10^{-3}$ and $10^{-5}$ mbar, the evaporation of the compound of the formula I, II, III and/or IV is brought about by heating at temperatures of from 200° C. to 600° C., or 300° C. to 500° C. In the course of the process, this compound is deposited on the surface of the optical substrate to form a thin coat. In order to improve adhesion of the coat it may be expedient to heat the substrate to a temperature of between 20° C. and 300° C., preferably between 40° C. and 200° C. The coat thickness to be achieved is dependent on the duration of the process or, in the case of quantitative evaporation, on the quantity of compound of the formula I, II, III and/or IV introduced. Coat thicknesses of between 2 and 200 µm are commonly established for water-repellent coatings of this type.

The water-repellent coatings produced with the compounds of the formula II, III and/or exhibit a number of unforeseeable advantages over coats produced using materials which have been employed for this purpose to date. In addition to the fact that the coatings exhibit an exemplary water-repellent behavior, they are considerably more resistant to mechanical and chemical influences. They are substantially more firmly adhering and more durable; their resistance to wiping and scratching, and their stability to moist warm air, physiological saline solution, elevated temperature or the action of UV radiation, is substantially higher than in the case of coatings with materials and methods according to the prior art.

Water-repellent coats or abrasion-resistant coatings with compounds of the formula II, III and/or IV according to the method of the invention can be applied to all kinds of optical substrates. Their use is particularly advantageous on optical substrates which have been provided beforehand with thin coats for surface upgrading and/or reflection reduction.

Without further elaboration, it is believed that one skilled in the art can, using the preceding description, utilize the present invention to its fullest extent. The following preferred specific embodiments are, therefore, to be construed as merely illustrative, and not limitative of the remainder of the disclosure in any way whatsoever.

In the following examples, all temperatures are set forth uncorrected in degrees Celsius and unless otherwise indicated, all parts and percentages are by weight.

EXAMPLES

A mixture comprising 35% by weight silica, 55% by weight alumina and 10/o by weight Yttria of particles sizes between 20–40 micrometers was mixed with a concentrated solution of organosiloxazane polymer (KP801, Shin-Etsu Chemical Co., manufactured and disclosed in U.S. Pat. No. 4,678,688). The mixture was poured into a pan and the solvent (in the polymer) allowed to evaporate from the mixture with the ceramic. The dried ceramic cake was sieved through a #16 sieve to achieve an appropriately sized powder. The powder was then mixed with a lubricant (any lubricant is deemed satisfactory, particularly inert lubricants and non-polar lubricants, but a hydrocarbon wax, Carbowax Sentry, Union Carbide was used in this example). The mixture of powder and lubricant was then simply pressed into a tablet with a hydraulic press.

A tablet made by this process was placed in a boat made of sheet molybdenum that was placed into a commercial high-vacuum evaporation unit (DL900, Satis Vacuum, Inc.). It Polycarbonate ophthalmic lenses to be coated were placed in a substrate carrier of the unit. The unit was then evacuated to a residual pressure of $3 \times 10^{-5}$ mbar. The substrates were then heated to 70° C. and a standard antireflection coating (consisting of alternating layers of titania and silica) was deposited with the appropriate thickness of each adjusted for the refractive index of the lens material. The molybdenum boat was then heated to about 400° C. Under these conditions, the organosiloxazane present in the tablet evaporated and deposited a clear film on the lenses. The lenses were removed from the chamber and the coating thickness was measured at about 5–10 micrometers.

The hydrophobicity of the coating was determined by a standard process of measuring the contact angle that a drop of water makes with the surface of the coating. The contact angle of the above prepared coated anti-reflective coating with the hydrophobic coating layer was measured at 1040 (Tantec Contact Angle Meter). The durability of the coating was determined by rubbing the coating and remeasuring the contact angle. The coating was rubbed for 1000 strokes with a MIL-STD-440 cheesecloth under a 6.62 pound weight with a device that makes controlled rubbing of a curved surface (Sutherland Ink Rub Tester). The resultant contact angle was still measured at 104°.

Comparative Example A

A tablet made by the same sintering process of U.S. Pat. No. 5,853,800 was placed in a molybdenum boat in the same evaporation unit as in Example 1, and a film of the same chemical composition and the same thickness was deposited on the anti-reflective coated lenses as described in Example 1. The contact angle of the initial resultant coating was measured at 104° C. The contact angle of that coating provided by the evaporation of the same chemistry from the sintered tablet, after 1000 rubs with the MIL-STD440 cheesecloth under a 6.62 pound weight with a device that makes controlled rubbing of a curved surface (Sutherland Ink Rub Tester) was measured at only 100° C. This shows at least that different chemical compositions (and possibly even that the same chemical composition), deposited in approximately the same amount and thickness, at the same temperature, in the same evaporation unit, provided improved durability when the source of the chemistry was altered from a sintered tablet to a merely compressed (not sintered) tablet. This is a surprising result for which no technical explanation can be provided.

The preceding examples can be repeated with similar success by substituting the generically or specifically described reactants and/or operating conditions of this invention for those used in the preceding examples.

From the foregoing description, one skilled in the art can easily ascertain the essential characteristics of this invention, and without departing from the spirit and scope thereof, can make various changes and modifications of the invention to adapt it to various usages and conditions.

What is claimed:

1. A method of preparing water-repellent coatings on an ophthalmic lens comprising thermal vapor coating said optical substrate with at least one organosilane compound in a vacuum, wherein said thermal vapor coating comprises:

impregnating a non-sintered porous inorganic oxide matrix material consisting essentially of an inorganic oxide matrix of silica, yttria, titania, zirconia, magnesium oxide, alumina, or mixtures thereof with at least one organosilane of the formula I:

$$C_nF_{2n+1}C(CH_2)_mCSi(R^1R^2R^3) \qquad (I)$$

in which $R_1$ is alkoxy having 1 to 3 carbon atoms or is $C_nF_{2n+1}C(CH_2)_mCSi(R^2R^3)COC$, $R^2$ and $R^3$ are alkyl or alkoxy groups having 1 to 3 carbon atoms, n is 1 to 12, and m is 1 to 6;

evaporating the at least one organosilane compound from the matrix material in a vacuum of from $10^{-3}$ to $10^{-5}$ mbar at 200° C. to 600° C.; and depositing the evaporated at least one organosilane compound on the surface of the ophthalmic lens heated to 30° C. to 300° C., wherein the inorganic oxide matrix material consists of silica, alumina, and yttria.

2. The method of claim 1 wherein in the organosilane compound, $R^2$ and $R^3$ are alkyl or alkoxy groups having 1 carbon atom.

3. The method of claim 1 wherein in the organosilane compound, $R^1$ is alkoxy having 1 to 3 carbon atoms.

4. The method of claim 1 wherein the inorganic oxide matrix consists of 35% by weight silica, 55% by weight alumina, and 10% by weight of yttria.

5. The method of claim 4 wherein particles of the matrix are between 20–40 micrometers.

6. The method of claim 4 wherein in the organosilane compound, $R^2$ and $R^3$ are alkyl or alkoxy groups having 1 carbon atom.

7. The method of claim 4 wherein in the organosilane compound, $R^1$ is alkoxy having 1 to 3 carbon atoms.

* * * * *